United States Patent [19]
Lei et al.

[11] Patent Number: 6,050,446
[45] Date of Patent: Apr. 18, 2000

[54] PIVOTING LID ASSEMBLY FOR A CHAMBER

[75] Inventors: Lawrence Lei, Milpitas; Son Trinh, Cupertino; Gwo-Chuan Tzu, Sunnyvale; Mark Johnson, San Jose, all of Calif.

[73] Assignee: Applied Materials, Inc., Santa Clara, Calif.

[21] Appl. No.: 08/893,410

[22] Filed: Jul. 11, 1997

[51] Int. Cl.[7] .................................................. B65D 43/24
[52] U.S. Cl. ......................... 220/819; 220/264; 220/828
[58] Field of Search .................................. 220/335, 337, 220/262–264, 255, 819, 259, 810, 582; 217/60 E, 60 F; 110/173 R, 173 B, 173 C

[56] References Cited

U.S. PATENT DOCUMENTS

| | | | |
|---|---|---|---|
| 1,033,448 | 7/1912 | Mueller | 220/333 X |
| 2,070,663 | 2/1937 | Klein et al. | 220/335 X |
| 2,923,430 | 2/1960 | Stengele | 220/264 |
| 3,195,873 | 7/1965 | Phlbrick, Jr. | 220/263 X |
| 3,269,587 | 8/1966 | Svenson | 220/582 |
| 4,169,538 | 10/1979 | Bird et al. | 220/810 |
| 4,516,689 | 5/1985 | Barker | 220/259 X |
| 4,788,999 | 12/1988 | Dalpane | 220/335 X |
| 4,853,985 | 8/1989 | Perry | 220/335 X |
| 4,951,601 | 8/1990 | Maydan et al. | 118/719 |
| 4,961,601 | 10/1990 | Maydan et al. | 118/719 |
| 5,205,532 | 4/1993 | Naehring | 251/85 |
| 5,513,768 | 5/1996 | Smith | 220/259 |
| 5,731,678 | 3/1998 | Zila et al. | 318/568.11 |

FOREIGN PATENT DOCUMENTS

| | | | |
|---|---|---|---|
| 1121586 | 1/1962 | Germany | 220/332 |
| 77852 | 3/1993 | Japan | 220/335 |
| 79996 | 9/1918 | Switzerland | 220/333 |
| 25738 | 9/1913 | United Kingdom | 220/333 |

OTHER PUBLICATIONS

European International Search Report Dated Nov. 5, 1998.

*Primary Examiner*—Allan N. Shoap
*Assistant Examiner*—Robin A. Hylton
*Attorney, Agent, or Firm*—Thomason, Moser & Patterson

[57] ABSTRACT

A lid assembly for a process chamber. The lid assembly includes a hinge having a hinge mount affixed to the chamber and a hinge arm. A pin extends from the hinge mount through an elongated slot in the hinge arm allowing both rotational and longitudinal motion of the hinge arm relative to the hinge mount. A support frame attached to the hinge arm has two side arms that extend perpendicularly from the hinge arms toward the front of the chamber. The lid is pivotally connected to the side arms by a pivot connection aligned with the center of mass of the lid. A detent extends from the lid through a slot in the side arm at a position offset from the pivot connection. The detent and slot serve to limit the allowable rotation of the lid relative to the lid support frame. Thus, the lid is allowed to float over the opening of the chamber as the lid is closed so that the lid may be positioned in parallel alignment relative to the opening of the chamber before being secured to the chamber.

16 Claims, 3 Drawing Sheets

PIVOTING LID ASSEMBLY FOR A CHAMBER

BACKGROUND OF THE INVENTION

1. Field of the Invention

The present invention relates to the field of semiconductor substrate processing equipment More particularly, the present invention relates to an improved lid assembly for a process chamber that allows the lid to "float" above the chamber so that the lid may be properly centered on the chamber.

2. Background of the Related Art

In the fabrication of integrated circuits, equipment has been developed to automate substrate processing by performing several sequences of processing steps without removing the substrate from a vacuum environment, thereby reducing transfer times and contamination of substrates. Such a system has been disclosed for example by Maydan et al., U.S. Pat. No. 4,951,601, in which a plurality of processing chambers are connected to a transfer chamber. A robot in a central transfer chamber passes substrates through slit valves in the various connected processing chambers and retrieves them after processing in the chambers is complete.

The processing steps carried out in the vacuum chambers typically require the deposition or etching of multiple metal, dielectric and semiconductor film layers on the surface of a substrate. Examples of such processes include chemical vapor deposition (CVD), physical vapor deposition (PVD), and etching processes. Although the present application primarily discusses CVD processes, the present invention is equally applicable to other processes as well.

Process chambers are employed to deposit thin films on semiconductor substrates. Typically, in a CVD process, a precursor gas is charged into a process chamber through a gas manifold plate situated above the substrate. The precursor gas reacts on the heated substrate surface to deposit a thin layer thereon.

To increase manufacturing efficiency and device capability, the thin films deposited on the substrates must be of uniform thickness across the substrate so that all of the devices on the substrate are uniform. Additionally, increased throughput requires that as much of the upper surface area of each of the substrates be utilized while preventing edge and backside deposition on the substrate. Material deposited on the beveled edge and the relatively rough backside of the substrate has a tendency to flake off and create particles which are harmful to the processing equipment as well as the substrates and devices being processed. One way to help ensure that the films are uniform and that the required portions of the substrate are properly shielded is to utilize tight tolerances in aligning the various components of the system. For example, in a typical CVD process chamber the components to be aligned include the substrate and the shielding shadow ring positioned over the substrate which are aligned relative to the gas manifold that is typically positioned in the lid of the process chamber.

The lids for the process chambers are connected to the chamber by a hinge and may be selectively opened during down times to perform maintenance on the process chambers. Therefore, the interface between the lid and the process chamber must include a seal to maintain the vacuum in the process chamber and to prevent the gases used in the process from leaking into the environment. Further, when the lid is closed, it must be properly positioned on the process chamber to align the chamber components in the lid (e.g., a gas manifold in a CVD process) to the other process chamber components, such as the support member and a substrate positioned thereon.

One prior art process chamber having a lid that may be selectively opened is shown in FIG. 1. As shown in the figure, the lid is connected to the process chamber by a hinge at the back of the lid. A pneumatic cylinder attached to the process chamber and to the lid at a point intermediate the front and the back of the lid provides support and assists in opening and closing the lid. The hinges include an arm attached to the lid at the top end of the arm and attached to a hinge mount at the bottom end of the arm. The hinge mount has a circular pin extending horizontally therefrom that extends through an elongated slot (i.e., oval-shaped holes) in the arm. Thus, as the lid is opened and, thereby, rotated about the hinge, the arm is free to move longitudinally relative to the pin because of the slot. Likewise, the lid has a limited ability to "float," or move, above the process chamber as the lid is closed and before being secured to the chamber. In this way, as the lid is closed, the back of the lid may be lifted, so that the lid can be positioned in parallel alignment with the process chamber before closing, and the lid is then lowered over the opening. Therefore, the position of the lid on the chamber is adjustable to permit proper placement for alignment and for proper sealing.

However, in the quest for greater throughput, the size of the substrates has become larger which, in turn, requires larger process chambers to accommodate the substrates. The larger chambers require larger lids which are heavier and more difficult to open and close. Consequently, the heavier lids of the larger chambers are more difficult to properly align as the lid is closed because the heavier lid is more difficult to lift and manipulate than the smaller lids of the previous designs. Therefore, with a heavier lid it is more difficult to obtain the needed alignment of the lid relative to the chamber and, thus, to obtain the required seal.

Therefore, there is a need to provide an improved lid that is more easily opened and closed and that facilitates proper placement of the lid on the chamber.

SUMMARY OF THE INVENTION

The present invention generally provides a lid assembly that allows the lid to float above the process chamber before the lid is secured to the chamber. More particularly, the present invention provides a lid assembly for a chamber that includes a lid support frame. A plurality of hinges connect the lid support frame to the chamber. The lid is then pivotally connected to the lid support frame, preferably near the center of mass of the lid to form a pivot connection, so that the lid can be positioned in parallel alignment relative to the chamber before being lowered onto the chamber and can be aligned with the chamber before being secured thereto. A detent extends from the side of the lid through an elongated slot in the lid support frame to limit the allowable rotation and movement of the lid relative to the lid support frame. The hinges include an arm attached to the lid at the top end of the arm and attached to a hinge mount at the bottom end of the arm. The hinge mount has a circular pin extending horizontally therefrom that extends through an elongated slot (i.e., oval-shaped hole) in the arm. Thereby, the hinge allows the lid support frame to move relative to the chamber and, thus, provides relative movement between the lid, which is attached to the lid support frame, and the chamber. Additional relative movement between the lid and the lid support frame and, thus, the chamber is provided by the pivot connection of the lid to the lid support frame. Providing the additional relative movement between the lid and the chamber allows a greater degree of float of the lid relative to the chamber. A cylinder attached to the chamber and to the lid support frame provides support and assists in opening and closing the lid.

Another aspect of the invention is a process chamber comprising a chamber body having the lid assembly, previously described, attached thereto.

A further aspect of the invention is a method for positioning a lid on a process chamber comprising floating the lid relative to the process chamber using a lid support frame during closing of the lid. Floating of the lid generally involves supporting the lid above the chamber over an opening of the process chamber to be closed by the lid and adjusting the angle of the lid relative to the process chamber so that it is in parallel alignment thereto. Floating the lid also may involve lifting the back of the lid support frame as the lid is closed and rotating the lid relative to the lid support frame about a pivot point positioned intermediate the front and back of the lid until the lid is in parallel alignment with the opening.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
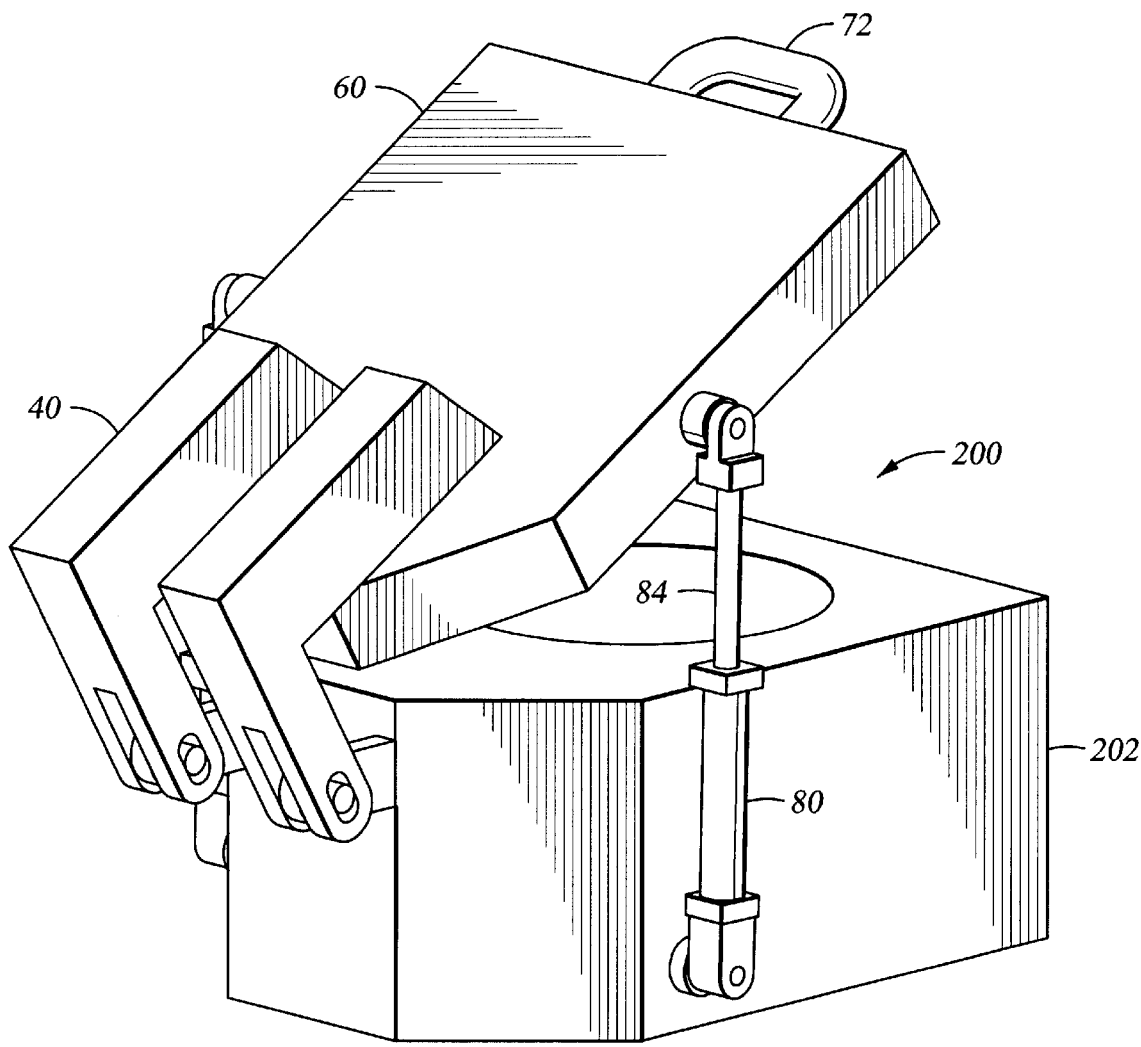
FIG. 1 is a perspective view of a prior art process chamber showing the lid attached to the chamber body.

The present invention generally provides an improved lid assembly 10 that allows the lid 60 to "float" over the process chamber 200 before the lid 60 is secured to the chamber 200. The term "float" as used herein shall mean that the lid 60 is free to move relative to the chamber body 202 and may be positioned and supported over the opening 204 and the chamber body 202 and moved into parallel alignment relative thereto so that it may be lowered onto the opening. "Parallel alignment" means that the lid 60 at any given position is oriented with the chamber body 202 so that the mating surfaces (e.g., the seal 92 shown in FIG. 3) of the lid 60 and the chamber body 202, that are in mating abutment when the lid 60 is positioned over and secured to the chamber body 202 covering the opening 204, are parallel to one another.

The following description refers to a fabrication system in which substrates 98 are processed in a horizontal plane such as in a CENTURA® platform manufactured by Applied Materials, Inc. of Santa Clara, Calif. The invention may be applied to other platforms in which substrates 98 are processed in a vertical plane. Additionally, for ease of description and clarity, the following description refers primarily to a CVD process chamber, such as a $D_xZ$ or $W_xZ$ chamber available from Applied Materials, Inc., although the present invention is equally applicable to other types of process chambers 200.

Figure 2:
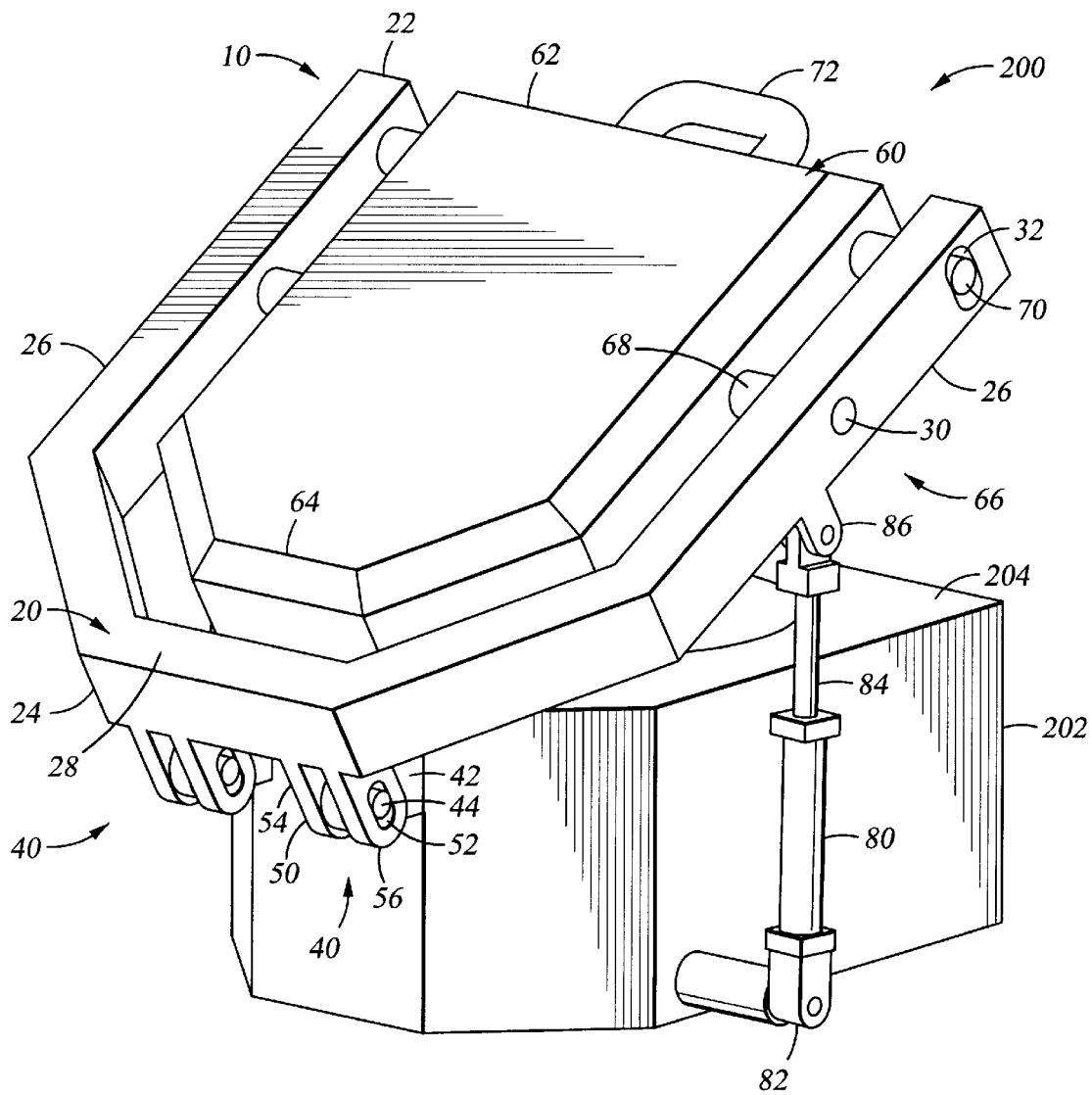
FIG. 2 is a partially exploded perspective view of a process chamber with the lid assembly attached thereto.
Figure 3:
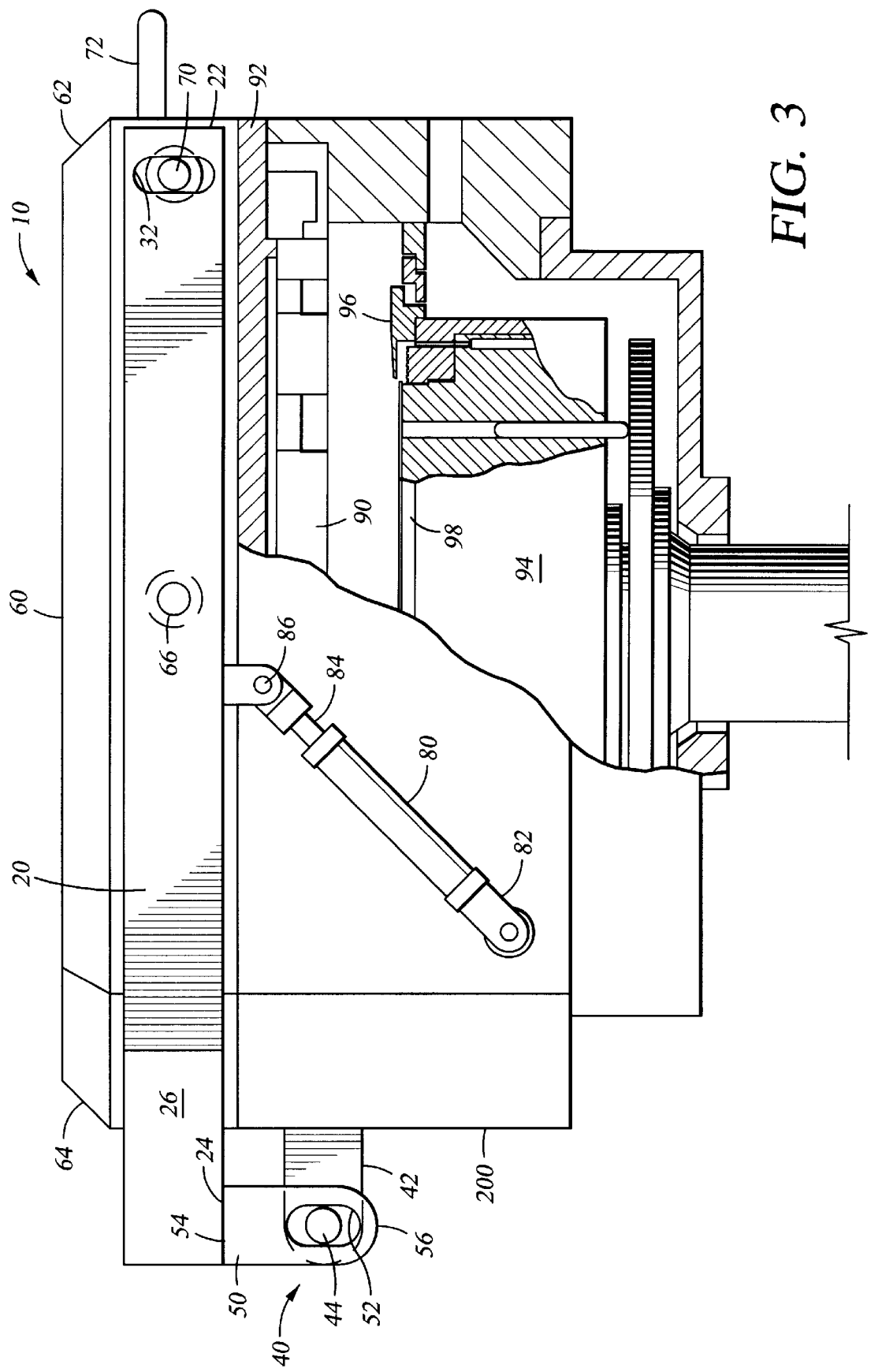
FIG. 3 is a partial cross sectional side elevational view of the process chamber with the lid assembly attached thereto.

FIGS. 2 and 3 show a process chamber 200 with the lid assembly 10 attached thereto. The following discussion refers to the device shown in these figures. Generally, a process chamber 200 has a chamber body 202 that encases the various components of the process chamber 200. So that maintenance may be performed on the process chamber 200, the chamber body 202 defines an opening 204 that is typically located at the top of the process chamber 200. The opening 204 is, sufficiently large to provide access to the internal components of the process chamber 200. During processing of substrates 98, the process chamber must maintain a vacuum therein and must provide a sealed environment from which the processing gases cannot escape. Therefore, the process chamber 200 must include a removable lid 60 that covers and seals the opening 204 when closed, but that may be selectively opened to provide access to the interior of the process chamber 200. When open, the lid 60 must be completely clear of the entire opening 204 so that components that occupy substantially the full interior of the process chamber 200, such as an annular chamber insert, may be removed therefrom. The relative position of the lid 60 to the opening 204 and the chamber body 202 when the lid 60 is closed is crucial to ensure a proper seal therebetween. In addition, the lid 60 commonly incorporates one or more components of the processing components of the process chamber 202 which must be properly aligned relative to the other processing components. For example, as shown in FIG. 3, in a CVD process chamber, the gas manifold 90 used to disperse the process gas into the process chamber 200 is typically located in the lid 60. Therefore, to facilitate repeatability and accuracy of the process, the lid 60 must be properly positioned on the chamber body 202 so that the gas manifold 90 will be aligned with the other process components, such as the support member 94 and the shadow ring 96, and with the substrate 98 during processing.

Additionally, the lid 60 for the process chamber 200 is relatively heavy making opening and closing of the lid relatively difficult. This difficulty is only exacerbated as the size of the process chamber 200 and the lid 60 become larger. When closing a large, heavy lid 60, it is difficult to properly align the lid 60 and, thus, obtain a proper seal. The present invention addresses this problem by providing a lid assembly 10 attached to the chamber body 202 that allows the lid 60 to float over the opening 204 and the chamber body 202 before being secured to the chamber body 202.

The lid assembly 10 generally comprises a lid support frame 20, a hinge 40 and a lid 60 pivotally connected to the lid support frame 20. As used herein, the back of the process chamber 200 is the side to which the lid assembly 10 is pivotally attached and the front is the side opposite the back and furthest from the side to which the lid assembly 10 is pivotally attached.

The hinge 40 includes a hinge mount 42 affixed to the back of the chamber body 202 and a hinge arm 50 pivotally connected to the hinge mount 42. The hinge mount 42 is a relatively flat plate that extends perpendicularly from the back of the chamber body 202. A pin 44 extends perpendicularly from the sides of the hinge mount 42 to mount the hinge arm 50 and the attached lid support frame 20 to the hinge mount 42. The pin 44 may be either permanently affixed to the hinge mount 42 or may be rotatably positioned through a hinge pin hole extending through the hinge mount 42. Preferably, the pin 44 has a circular cross sectional shape and extends from both sides of the hinge mount 42. The process chamber 202 preferably includes two hinges 40, and hinge mounts 42, attached to the chamber body 202, one attached to the right side of the back of the chamber body 202 and one attached to the left side of the back of the chamber body 202.

The hinge arm 50 is an elongated member adapted to mate with the hinge mount 42 to provide the hinge connection. The hinge arm 50 includes a slot 52 therethrough that is adapted to receive the pin 44 therethrough. The slot 52 is elongated having a width that is slightly greater than the diameter of the pin 44 and a length that is preferably at least about 1.5 times the diameter of the pin 44, but preferably longer. Therefore, the hinge arm 50 is free to rotate about the pin 44. The hinge mount 42 supports the pin 44 in spaced relation to the back of the chamber body 202 so that the hinge arm 50 has room to rotate about the pin 44. Accordingly, the hinge arm 50 and the hinge mount 42 are adapted to allow the hinge arm to rotate at least ninety degrees from the closed position, wherein the hinge arm 50 is typically vertically oriented, to a horizontal orientation to allow the lid support frame 20 and the lid 60 to be rotated and moved completely away from the opening 204 so that the opening 204 is completely clear.

The slot 52 extends in a lengthwise direction in the hinge arm 50 to allow the hinge arm 50 to move longitudinally relative thereto. The lengthwise, or longitudinal, direction of the hinge arm 50 is the direction from its upper end 54 to its lower end 56. Note that the slot 52 may alternatively extend at an angle to the longitudinal direction to permit the hinge arm 50 to move generally longitudinally thereto, but at a slight angle from the longitudinal direction. This alternative design may, for example, allow the hinge arm 50, and the attached lid support frame 20 to move up and away from the chamber body 204. Preferably, the hinge arm 52 has two elongated plates that are mounted in parallel that are positioned with one on each side of the hinge mount 42 so that one of the elongated plates abuts one side of the hinge mount 42 and the other elongated plate abuts the other side of the hinge mount 42. Each of the elongated plates of the hinge arm 50 includes the slot 52 therethrough. The pin 44 extends through the hinge mount 42 and through the slots 52 in each of the elongated plates. In this way, the forces applied to the pin 44 are balanced on each end of the pin 44 and the hinge mount 42 reducing the moments and rotational forces applied thereto. The pin 44 may include an enlarged head at its end that is larger in diameter than the width of the slot 52 to prevent the hinge arm 50 from sliding laterally off of the pin 44. Thus, the hinge arm 50 slides on and rotates about the pin 44 attached to the hinge mount 42. Accordingly, the pin 44 and slot 52 connect the hinge mount 42 to the hinge arm 50 in such a way that the hinge arm 50 is free to rotate relative to the hinge mount 42, and the chamber body 202, and is free to move longitudinally, in the direction of the orientation of the slot 44, relative thereto.

An alternative design is to have the elongated slot 52 extending through the hinge mount 42 and the pin 44 attached to the hinge arm 50 so that the pin 44 is not free to move relative to the hinge arm 50. With this alternative design, the pin 44 attached to the hinge arm 50 slides in the slot 52 in the hinge mount 42 and accomplishes the same result.

Preferably, the slot 52 is positioned proximal the lower end 56 of the hinge arm 50. The upper end 54 of the hinge arm 50 is coupled to the lid support frame 20.

The lid support frame 20 has a front 22 and a back 24. The hinges 40, which are connected to each side of the back of the chamber body 202, are connected to each end of a back member 28, that extends between the hinges 40 at the back 24 of the lid support frame 20. More specifically, the upper end 54 of each of the hinge arms 50 is attached to an end of the back member 28. A side arm 26 is attached to each end of the back member 28 and extends from the back member 28 toward the front of the process chamber 200. Thus, when the lid support frame 20 is in the closed position, the side arms 26 extend parallel to one another from the back member 28 at the back of the process chamber 200 to the front of the process chamber 200 along the right and left sides of the process chamber 200. As the hinge arm 50 rotates about the pin 44, the back member 28 and the side arms 26 also rotate raising the front 22 of the lid support frame 20 from the opening 204 of the chamber body 202.

The lid support frame 20 is adapted to support the lid 60. The lid 60 has a size and shape that conforms to the size and shape of the opening 204 and includes a mating surface on its bottom that is adapted to mate with the chamber body 202 and provide a vacuum tight seal 92 therebetween. As previously mentioned, the lid 60 may incorporate process components such as a gas manifold 90 is a CVD process chamber. The lid 60 is pivotally attached to the lid support frame 20 at a point intermediate the front 62 and back 64 of the lid 60 so that the lid 60 is free to rotate about the pivot connection 66 and tilt in a forward and backward direction. Preferably, the pivot point between the front 62 and back 64 of the lid 60 is aligned with the center of mass, or centroid, therebetween so that the lid 60 is easily rotated about the pivot point within the lid support frame 20.

The pivot connection 66 on each side of the lid 60 includes a pin 68, or other mounting member, that extends perpendicularly from the side of the lid 60 through a pivot hole 30 in the side arm 26. The circular pin 68 has a diameter that is slightly smaller than the diameter of the circular pivot hole 30 allowing the pin 68 to rotate in the pivot hole 30. In an alternative design, the pin 68 extends perpendicularly from the side of the side arm 26 into a mating pivot hole 30 in the side of the lid 60. The pin 68 and pivot hole 30 are positioned so that when the lid support frame 20 is in the lowered, closed position, the lid 60 covers the opening 204 of the process chamber 200. Also, as previously mentioned, the pin 68 and pivot hole 30 are preferably aligned with the center of mass of the lid 60 intermediate the front 62 and back 64 of the lid 60.

At an offset position from the pivot connection 66, a detent 70 extends from the side of the lid 60 through an elongated, or oval-shaped, slot 32 that extends through the side arm 26. Preferably, a detent 70 extends from each side of the lid 60 to support the lid 60 with a limited range of allowable rotational movement about the pivot connection 66. The detent 70 has a diameter that is slightly less than the width of the slot 32 so that the detent 70 is free to slide in the slot 32. The slot 32 may be slightly arc-shaped (as shown in FIG. 3) having an arc radius equal to the distance from the pivot connection 66 to the slot 32 to facilitate sliding of the detent 70 in the slot 32 as the lid 60 rotates relative to the lid support frame 20. Accordingly, the slot 32 extends in a direction that facilitates rotation of the lid 60 relative to the lid support frame 20. However, the slot 32 is not open to the sides of the side arm 26, but instead is a hole through the side arm 26. In this way the motion of the detent 70 is limited by the length of the slot 32. Consequently, the rotation of the lid 60 relative to the lid support frame 20 is limited because the motion of the detent 70 attached to the lid 60 is limited. In particular, the allowable angle of rotation of the lid 60 relative to the lid support frame 20 is determined by the distance between the pivot connection 66 and the slot 32 and the length of the slot 32. Preferably, these dimensions are sufficient to allow a considerable rotation of the lid relative to the lid support frame 20.

A cylinder 80 that is either hydraulic or pneumatic provides support for the lid 60 and facilitates opening and closing of the lid 60. The back end 82 of the cylinder 80 is pivotally attached to the chamber body 202. The cylinder may be vertically disposed or angled as shown in FIG. 2 to facilitate opening and closing while also providing access to various chamber components such as gauges and detection windows or ports. The cylinder 80 includes a movable ram 84 therein that has a ram forward end 86 attached to the side arm 26 at a point intermediate the front 22 and back 24 of the lid support frame 20. The cylinder 80 has a fluid therein that exerts a force on and resists motion of the ram 84. Thus, when the lid support frame 20 is in the raised, open position, the cylinder 80 helps to support the weight of the lid 60 helping to prevent it from closing. However, the force exerted by the cylinder 80 is sufficiently light that it is easily overcome by a force applied to a handle 72 of the lid assembly 10.

In operation, when the lid assembly 10 is opened, the lid support frame 20 rotates about the pin 44 of the hinge 40 lifting the lid 60 from the opening 204 of the process chamber 200. The cylinder 80 helps to support the lid assembly 10 in the open position. To close the lid assembly 10, the lid support frame 20 is rotated toward the chamber body 202 until the lid 60 is positioned over the opening 204. During the lowering of the lid assembly 10, the cylinder 80 helps support the weight of the lid assembly 10 allowing a controlled rotation of the lid assembly 10 onto the chamber body 202. As the lid 60 approaches the opening 204, the position of the lid 60 relative to the opening 204 may be adjusted because the lid 60 is free to float relative to the chamber body 202 within the lid support frame 20 which is itself free to float at the hinge 40 relative to the chamber body 202. The slotted hinge 40 allows the lid support frame 20 to be lifted as the lid 60 is lowered so that, with the lid support frame 20 lifted, the lid 60 may be supported over the opening 204 and placed in a parallel orientation relative to the opening 204 allowing the lid 60 to simply be lowered straight down, rather than having to be rotatably positioned into the opening 202. For example, as the lid support frame 20 is rotated downward, the hinge arm 50 is lifted relative to the hinge mount 42 lifting the back 24 of the lid support frame 20. With the back 24 of the lid support frame 20 raised, the lid 60 can be aligned in parallel orientation with the opening 204 before being fully lowered thereon so that the front 62 and back 64 of the lid 60 can be placed onto the chamber body 204 at the same time. However, with heavier, larger lids 60, manipulating the lid support frame 20 into parallel alignment is often difficult and impractical due to the weight. Therefore, the present invention incorporates the additional degree of float achieved by the pivot connection 66 connecting the lid 60 to the lid support frame 20 that allows the lid 60 to rotate relative to the lid support frame 20. Thus, even when the lid support frame 20 is positioned at a slight angle to the chamber body 204, the lid 60 can be rotated about the pivot connection 66 relative to the lid support frame 20 into parallel alignment wit the chamber body 202. Accordingly, the lid 60 floats more freely with the added degree of float of the present invention, particularly when the pivot connection 66 is aligned with the center of mass of the lid 60. The detent 70 and slot 32 limit the rotation of the lid relative to the lid support frame 20 maintaining the lid 60 in a position closely aligned with the lid support frame 20 so that, when the lid is rotated to a near closed position, the lid 60 is near parallel alignment. The detent 70 and slot 32 prevent the lid 60 from rotating substantially out of alignment with the lid support frame 20 where it could potentially damage other components as it rotated. The cylinder 80 helps support the weight of the lid assembly 10 allowing the aligning rotation during closing. Of course the lid 60 need not be perfectly aligned before being set into the opening 204 because when the lid 60 is slightly resting on the chamber body 202, it is still free to move slightly due to the slotted hinge 40 and the pivot connection 66 of the lid 60 to the lid support frame 20.

While the foregoing is directed at the preferred embodiment of the present invention, other and further embodiments of the invention may be devised without departing from the basic scope thereof, and the scope is determined by the claims which follow.

We claim:

1. A lid assembly for a chamber, comprising:
    a lid support frame;
    a hinge disposed on the lid support frame for coupling the lid support frame to the chamber;
    a lid pivotally coupled to the support frame; and
    a detent extending from the lid and slidably disposed in a slot in the lid support frame.

2. The lid assembly of claim 1, wherein the lid is pivotally connected to the lid support frame at a position intermediate a front and a back of the lid.

3. The lid assembly of claim 2, wherein the lid is pivotally connected to the lid support frame at a position aligned with a center of gravity of the lid.

4. The lid assembly of claim 1, wherein the hinge comprises:
    a hinge mount;
    a pin extending from the hinge mount; and
    a hinge arm coupled to the lid support frame, wherein the pin is slidably disposed in an elongated slot in the hinge arm.

5. The lid assembly of claim 1, further comprising:
    a cylinder having a back end and a ram, the ram having a ram forward end attached to the lid support frame.

6. A process chamber, comprising:
    a chamber body;
    a lid support frame;
    a hinge disposed on the lid support fame coupling the lid support frame to the chamber body;
    a lid pivotally coupled to the lid support frame; and
    a detent extending from the lid through a slot disposed in the lid support frame.

7. The process chamber of claim 6, wherein the lid is pivotally coupled to the lid support frame at a position intermediate a front and a back of the lid.

8. The process chamber of claim 7, wherein the lid is pivotally coupled to the lid support frame at a position aligned with a center of gravity of the lid.

9. The process chamber of claim 6, further comprising:
    a cylinder coupling the chamber body to the lid support frame.

10. The process chamber of claim 6, wherein the hinge comprises:
    a hinge mount coupled to the chamber body;
    a hinge aim coupled to the lid support frame, the hinge having an elongated slot disposed therethrough; and
    a pin extending at least partially through the slot.

11. A method for positioning a lid on a process chamber, comprising floating the lid relative to the process chamber using a lid support frame wherein the lid is pivotally coupled to the lid support frame and a detent extends from the lid through a slot in the lid support frame.

12. The method of claim 11, further comprising the steps of:

supporting the lid above the process chamber over an opening of the process chamber to be closed by the lid;

adjusting the angle of the lid relative to the process chamber; and lowering the lid onto the process chamber.

13. The method of claim 11, further comprising the steps of:

lifting a back of the lid support frame as the lid is lowered to a closed position;

rotating the lid relative to the lid support frame about a pivot point positioned intermediate a front and a back of the lid until the lid is in parallel alignment with an opening of the process chamber; and positioning the lid over the opening to seal the opening.

14. The method of claim 11 wherein the lid support frame is coupled to the process chamber by a cylinder.

15. The lid assembly of claim 1 wherein the slot in the lid support frame comprises an arc-shaped slot spaced from the pivot connection.

16. The process chamber of claim 16 wherein the slot in the lid support frame comprises an arc-shaped slot spaced from the pivot connection.

* * * * *